United States Patent
Yamamoto et al.

(10) Patent No.: US 8,471,754 B2
(45) Date of Patent: Jun. 25, 2013

(54) TIME MEASUREMENT CIRCUIT

(75) Inventors: Kazuhiro Yamamoto, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 196 days.

(21) Appl. No.: 13/056,038

(22) PCT Filed: Jun. 24, 2009

(86) PCT No.: PCT/JP2009/002906
§ 371 (c)(1),
(2), (4) Date: Jan. 26, 2011

(87) PCT Pub. No.: WO2010/013385
PCT Pub. Date: Feb. 4, 2010

(65) Prior Publication Data
US 2011/0133973 A1      Jun. 9, 2011

(30) Foreign Application Priority Data
Aug. 1, 2008   (JP) .................................. 2008-199955

(51) Int. Cl.
*H03M 1/50*   (2006.01)
(52) U.S. Cl.
USPC .......................................... 341/166; 341/155
(58) Field of Classification Search
USPC .......................................... 341/155, 157, 166
See application file for complete search history.

(56) References Cited

U.S. PATENT DOCUMENTS

| | | | | |
|---|---|---|---|---|
| 4,303,983 A | * | 12/1981 | Chaborski | 702/176 |
| 6,545,518 B2 | * | 4/2003 | Saeki | 327/116 |
| 7,017,069 B2 | * | 3/2006 | Kudo et al. | 713/500 |
| 7,030,676 B2 | * | 4/2006 | Hazucha et al. | 327/263 |
| 7,119,582 B2 | * | 10/2006 | Adkisson | 327/3 |
| 7,498,856 B2 | * | 3/2009 | Lin et al. | 327/156 |
| 7,564,284 B2 | * | 7/2009 | Henzler et al. | 327/261 |
| 7,586,351 B2 | * | 9/2009 | Aoki | 327/263 |
| 7,605,805 B2 | * | 10/2009 | Jung et al. | 345/173 |
| 7,843,374 B2 | * | 11/2010 | Kojima | 341/160 |

FOREIGN PATENT DOCUMENTS

| | | | |
|---|---|---|---|
| EP | 0505324 | * | 9/1992 |
| JP | 6-6185 A | | 1/1994 |
| JP | 6-138261 A | | 5/1994 |
| JP | 8-54481 A | | 2/1996 |
| WO | 03/036796 | | 5/2003 |

OTHER PUBLICATIONS

PCT International Search Report and Written Opinion issued in PCT Application No. PCT/JP2009/002906 and mailed on Aug. 4, 2009, with English-language translations.
PCT International Preliminary Report on Patentability issued in PCT/JP2009/002906 and mailed on Mar. 17, 2011.

\* cited by examiner

*Primary Examiner* — Peguy Jean Pierre
(74) *Attorney, Agent, or Firm* — Ladas & Parry LLP (57) ABSTRACT

A time measurement circuit measures the time difference between edges of a first signal and a second signal. A sampling circuit acquires the logical level of the first signal at a timing of the edge of the second signal. When a sampling circuit enters a metastable state, an output signal thereof transits with a long time scale. A transition time measurement circuit measures a transition time (settling time) of the output signal of the sampling circuit in the metastable state.

16 Claims, 11 Drawing Sheets

TIME MEASUREMENT CIRCUIT

CROSS REFERENCE TO RELATED APPLICATIONS

This application is the U.S. National Stage of International Patent Application No. PCT/JP2009/002906 filed on Jun. 24, 2009 which claims priority to Japanese Patent Application No. 2008-199955 filed on Aug. 1, 2008, the disclosures of which are hereby incorporated by reference in their entirety.

BACKGROUND OF THE INVENTION

1. Field of the Invention

The present invention relates to a time measurement technique.

2. Description of the Related Art

Time to digital converters (which will be referred to as "TDCs" hereafter) are known that are configured to convert the time difference in transition timing between a first signal (which will be referred to as the "start signal" hereafter) and a second signal (the "stop signal") into a digital value. A method employing a vernier delay circuit has been proposed as a TDC having high time resolution.

Figure 1:
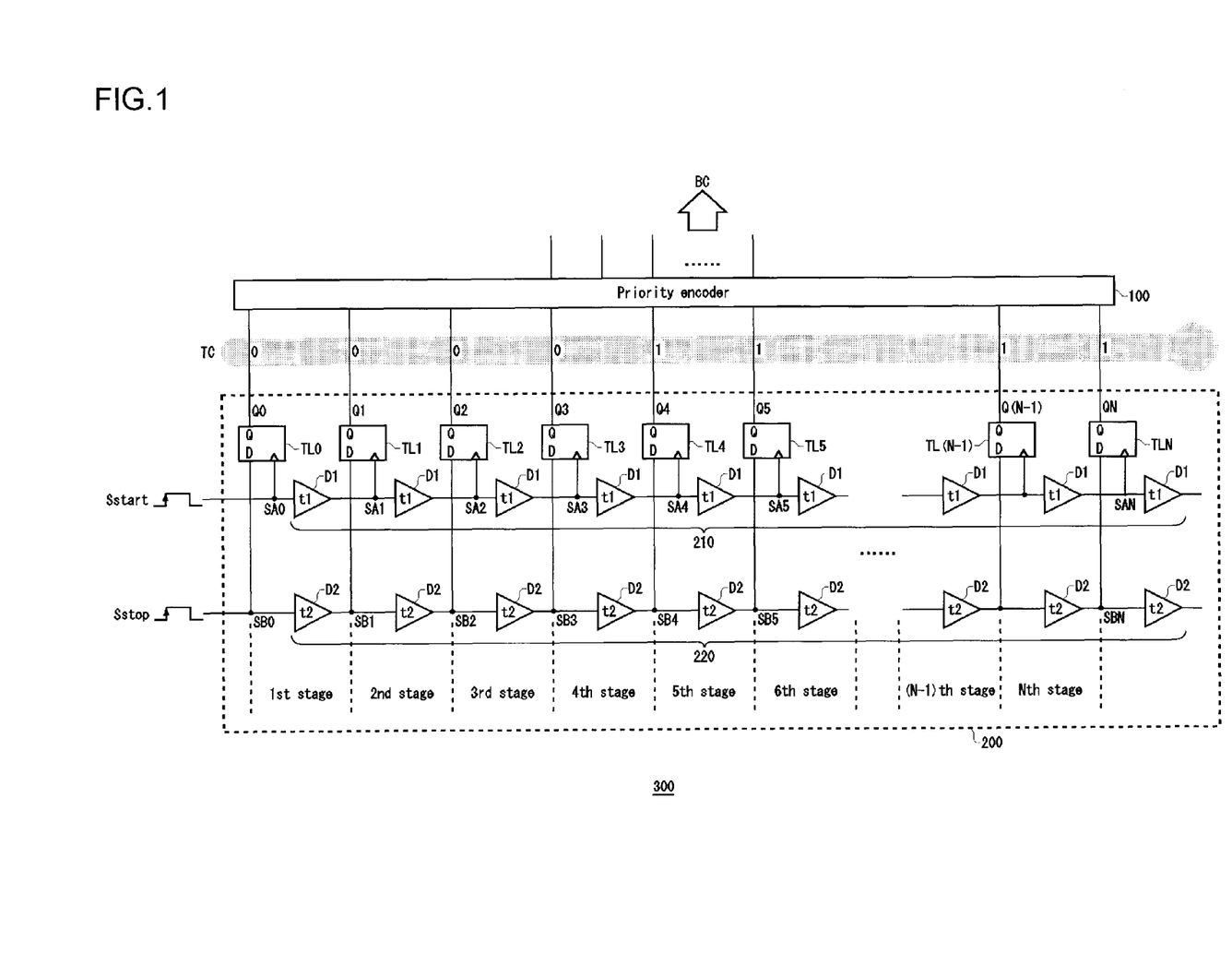
FIG. 1 is a diagram which shows a configuration of a TDC employing a vernier delay circuit.

FIG. 1 is a diagram which shows a configuration of a TDC 300 employing a vernier delay circuit 200. The TDC 300 includes the vernier delay circuit 200 and a priority encoder 100. The vernier delay circuit 200 receives a start signal Sstart and a stop signal Sstop, and generates a thermometer code TC in which the bits change at a particular bit position that corresponds to the time difference between these two signals. The vernier delay circuit 200 includes a first delay circuit 210, a second delay circuit 220, and thermometer latches TL0 through TLN.

The first delay circuit 210 includes N multistage connected first delay elements D1. The first delay circuit 210 applies a first predetermined delay amount t1 to the start signal Sstart at every stage, and outputs (N+1) delayed start signals $SA_0$ through $SA_N$ to which different respective delay amounts are applied. In the same way, the second delay circuit 220 includes N multistage connected second delay elements D2. The second delay circuit 220 applies a second predetermined delay amount to the stop signal Sstop at every stage, and outputs (N+1) delayed stop signals $SB_0$ through $SB_N$ to which different respective delay amounts are applied.

The first predetermined delay amount t1 is set to be longer than the second predetermined delay amount t2. The relative time difference between the start signal Sstart and the stop signal Sstop is reduced by $\Delta t=(t1-t2)$ every time the start signal Sstart and the stop signal Sstop respectively pass through a delay element stage of the first delay circuit 210 and the second delay circuit 220. In a case in which the initial time difference between the start signal Sstart and the stop signal Sstop is π, the edge timing relation between these two signals reverses at a stage in which the start signal Sstart and the stop signal Sstop have each passed through $(\pi/\Delta t)$ delay element stages.

The j-th (j represents an integer which satisfies the relation $0 \leq j \leq N$) thermometer latch TLj latches the delayed stop signal $SB_j$ output from the j-th stage delay element at a timing of the delayed start signal $SA_j$ output from the j-th stage delay element. In the present specification, the stage immediately before the first stage will be referred to as the "0-th stage" for convenience. That is to say, the 0-th thermometer latch TL0 receives the start signal before any delay is applied and the stop signal before any delay is applied.

As a result, until the stage in which the stop signal Sstop catches up with the start signal Sstart, the corresponding thermometer latches TL each output an output signal of 0. After the stage in which the stop signal Sstop overtakes the start signal Sstart, the corresponding thermometer latches TL each output an output signal of 1. Thus, the data latched by the (N+1) thermometer latches TL0 through TLN is output as a thermometer code TC[0:N]. The term "thermometer code" is thus named because it operates in a manner similar to a thermometer, in that the value of the thermometer code is switched from 1 to 0 (or 0 to 1) with a particular bit as a boundary.

It should be noted that, in a case in which the stop signal Sstop cannot catch up with the start signal Sstart, all the bits of the thermometer code TC are set to 0, and in a case in which the stop signal Sstop is input before the start signal Sstart, all the bits of the thermometer code TC are set to 1.

RELATED ART DOCUMENTS

U.S. Pat. No. 4,494,021 specification
International Publication WO 03/36796 pamphlet The TDC shown in FIG. 1 has a resolution that is equal to the difference between the first predetermined amount t1 and the second predetermined amount t2, i.e., $\Delta t=(t1-t2)$, set for the vernier delay circuit 200. In a case in which a resolution of 10 ps is required, there is a need to design the delay amount of each of the delay elements D1 and D2 with high precision. If there are irregularities in the delay amounts of the first delay elements D1 and the second delay elements D2 due to process irregularities or due to temperature or power supply voltage, such an arrangement leads to a problem of insufficient resolution.

Furthermore, in a case in which the time measurement is performed over a time range of 1 ns using the TDC 300 shown in FIG. 1, such an arrangement requires 100 (=1 ns/10 ps) delay element stages, leading to a problem of a large circuit area.

Also, with the TDC 300 shown in FIG. 1, it is difficult to provide a resolution of 10 ps or less. Accordingly, in order to support next-generation high bit rate transmission, there is a demand for a TDC which provides high resolution.

SUMMARY OF THE INVENTION

The present invention has been made in order to solve these problems. Accordingly, it is an overall purpose of the present invention to provide a time measurement technique for solving at least one of the aforementioned problems.

An embodiment of the present invention relates to a time measurement circuit configured to measure the time difference between edges of a first signal and a second signal. The time measurement circuit comprises: a sampling circuit configured to acquire a logical level of the first signal at a timing of an edge of the second signal; and a transition time measurement circuit configured to measure the transition time of an output signal of the sampling circuit in a metastable state.

The sampling circuit is configured employing flip-flops or latch circuits. In a case in which the logical level of the first signal is acquired by such a circuit element using an edge of the second signal, the threshold timing is taken into account. That is to say, in a case in which the timing of the second signal is earlier than the threshold timing in a step for acquiring the logical level of a first signal that transits from low level to high level, the logical level thus acquired is low level, and in a case in which the timing of the second signal is later than the threshold timing, the logical level thus acquired is high level. Similarly, such a threshold timing exists with respect to a first signal having a logical level that transits from high level to low level. In a case in which the phase difference between the first signal and the second signal is close to the threshold timing, the circuit enters the metastable state. In the metastable state, the output signal gradually transits with a long time scale. With such an embodiment, the time difference (phase difference) between the first signal and the second signal is extended in the time axis direction using a latch circuit or a flip-flop that enters the metastable state. Thus, such an arrangement reduces the resolution required for the transition time measurement circuit while maintaining the overall resolution. Seen from another point of view, by raising the time resolution of the transition time measurement circuit, such an arrangement provides improved overall resolution.

Also, the transition time measurement circuit may comprise multiple latch circuits each configured to receive an output signal of the sampling circuit via a data terminal thereof. Also, the multiple latch circuits receive, as input signals, respective reference edge signals having predetermined time intervals.

Also, the transition time measurement circuit may generate the reference edge signals by delaying the second signal. The output signal of the sampling circuit starts to transit with the edge timing of the second signal as a trigger. Thus, by generating the reference edge signals using the second signal as a reference, such an arrangement is capable of appropriately measuring the period of time that elapses from the time point at which the transition starts.

Also, the transition time measurement circuit may further comprise multiple delay elements provided to the multiple respective latch circuits, each configured to apply a delay amount to the second signal. Also, each delay element may supply the second signal thus delayed to a clock terminal of the corresponding latch circuit as the reference edge signal.

Also, the transition time measurement circuit may further comprise multiple delay elements cascade-connected in multiple stages. Also, a delay amount may be applied to the second signal at every stage. Also, the delayed second signal output from each delay element may be supplied to a clock terminal of the corresponding latch circuit as the reference edge signal.

Also, the sampling circuit may be configured to be capable of adjusting the transition time of the output signal in a metastable state.

Also, the sampling circuit may comprise a buffer arranged on a path via which the output signal of the sampling circuit is fed back. Also, the buffer may be configured such that the size thereof is adjustable.

Also, the sampling circuit may comprise a buffer arranged on a path via which the output signal of the sampling circuit is fed back. Also, the buffer may be configured such that the bias state thereof is adjustable.

Another embodiment of the present invention relates to a time to digital converter configured to convert the time difference between the transition timings of a start signal and a stop signal into a digital value. The time to digital converter comprises: a delay circuit comprising multiple delay elements cascade-connected in multiple stages, and configured to apply different respective delay amounts to the start signal and the stop signal at every stage, and to output the delayed signals at every stage as a delayed start signal and a delayed stop signal; and time measurement circuits according to any one of the above-described embodiments, severally arranged for every stage of the delay circuits, and each configured to receive the delayed start signal output from the corresponding stage as the first signal, and the corresponding delayed stop signal as the second signal, and to measure the time difference between edges of the first signal and the second signal.

With such an embodiment, the time difference between the start signal and the stop signal is measured with coarse precision by means of the delay circuit and the sampling circuit of the time measurement circuit. Furthermore, such an arrangement is capable of measuring their time difference with fine precision by means of the time measurement circuit operating in the metastable state.

Yet another embodiment of the present invention relates to a time to digital converter. The time to digital converter comprises: a delay circuit comprising multiple delay elements cascade-connected in multiple stages, and configured to apply a delay amount to the start signal at every stage, and to output the delayed signal at every stage as a delayed start signal; and time measurement circuits according to any one of the above-described embodiments, severally arranged for each stage of the delay circuits, and each configured to receive the delayed start signal output from the corresponding stage as the first signal, and the stop signal as the second signal, and to measure the time difference between edges of the first signal and the second signal.

Yet another embodiment of the present invention relates to a time to digital converter. The time to digital converter comprises: a delay circuit comprising multiple delay elements cascade-connected in multiple stages, and configured to apply a delay amount to the stop signal at every stage, and to output the delayed signal at every stage as a delayed stop signal; and time measurement circuits according to any one of the above-described embodiments, severally arranged for each stage of the delay circuits, and each configured to receive the start signal as the first signal, and the delayed stop signal output from the corresponding stage as the second signal, and to measure the time difference between edges of the first signal and the second signal.

Yet another embodiment of the present invention relates to a test apparatus. The test apparatus comprises the above-described time to digital converter.

Yet another embodiment of the present invention relates to a time measurement method for measuring the time difference between a first signal and a second signal. The time measurement method comprises: inputting the first signal as a data signal to be sampled, and inputting the second signal as a sampling signal which indicates a sampling timing; and measuring a transition time of an output signal of the sampling circuit in a metastable state.

Also, the measurement operation may comprise latching the output signal of the sampling circuit in the metastable state using multiple reference edge signals having predetermined time intervals.

Yet another embodiment of the present invention relates to a method for measuring the time difference in a transition timing between a start signal and a stop signal. The method comprises: repeatedly applying, at each stage, a delay amount to at least one from among the start signal and the stop signal, thereby changing the relative interval between edges of the two signals; inputting, to a sampling circuit, the start signal thus generated for each stage as a data signal to be sampled and the stop signal thus generated for each stage as a sampling signal which indicates a sampling timing; and measuring a transition time of an output signal of the sampling circuit in a metastable state.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

Figure 2:
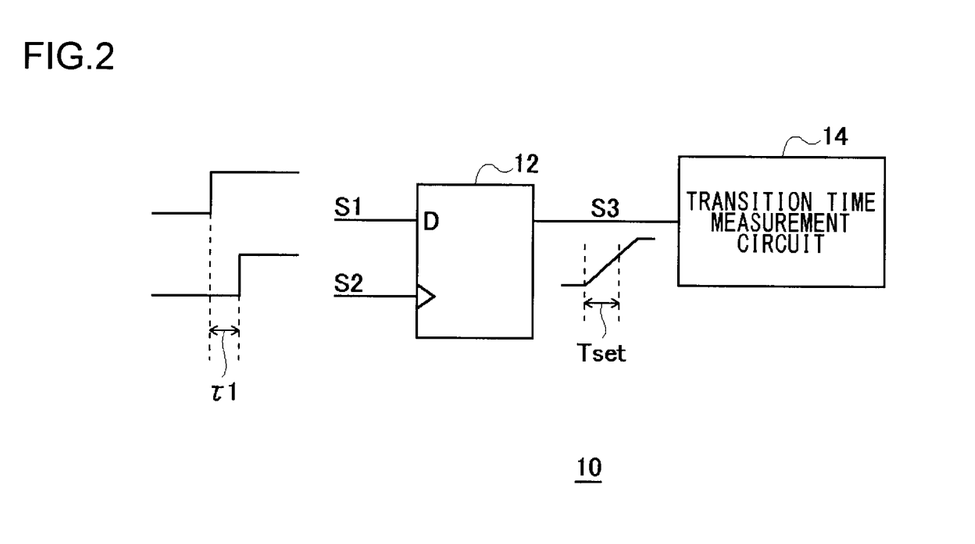
FIG. 2 is a block diagram which shows a configuration of a time measurement circuit according to an embodiment.

FIG. 2 is a block diagram which shows a configuration of a time measurement circuit 10 according to an embodiment. The time measurement circuit 10 receives a first signal S1 and a second signal S2, and has a function of measuring the time difference (phase difference) between the edges of these two signals. The time measurement circuit 10 includes a sampling circuit 12 and a transition time measurement circuit 14.

The sampling circuit 12 is a circuit configured to acquire (latch) the logical level of the first signal S1, which is configured as a multi-level digital signal, at a timing of each edge of the second signal S2. The sampling circuit 12 may be configured using various kinds of circuits including flip-flops, latch circuits, etc., and the configuration thereof is not restricted in particular. For simplicity of description, description will be made regarding an arrangement in which the first signal S1 is configured as a binary digital signal which is set to either high level or low level.

Description will be made regarding the operation of an arrangement configured to acquire a given data signal using a latch circuit configured to temporarily store a signal, or a flip-flop which provides a stable output operation. Logic circuits such as flip-flops, latch circuits, etc., each have a setup time Ts and a hold time Th as circuit properties. In a case in which a signal (data signal) to be acquired is acquired (latched) using a timing signal such as a clock signal used to indicate the sampling timing, the value of the data signal must be fixed at least the setup time Ts before the sampling timing ST defined by each edge of the timing signal. That is to say, the timing DT at which the data signal transits must be set to a time point at least the setup time Ts before the timing ST of each edge of the timing signal. That is to say, the following Expression (1) must be satisfied.

$$Tck - Tdata > Ts \tag{1}$$

When the condition defined by Expression (1) is satisfied, such a flip-flop or a latch circuit can acquire the value of a data signal at a sampling timing in a sure manner.

However, in a case in which the aforementioned Expression (1) is not satisfied, such a flip-flop or a latch circuit enters a metastable state, leading to a problem of an unstable output signal. Specifically, when such a metastable state occurs, the output signal of such a circuit transits gradually across a threshold value, i.e., an intermediate voltage between 0 and 1. Subsequently, the output signal reaches a level that corresponds to the data signal. That is to say, such a metastable state leads to a problem of a significantly longer period of time (settling time Tset) being required for the output signal of such a flip-flop or a latch circuit to reach a value that corresponds to the data signal, as compared with that in the normal operation.

Figure 3:
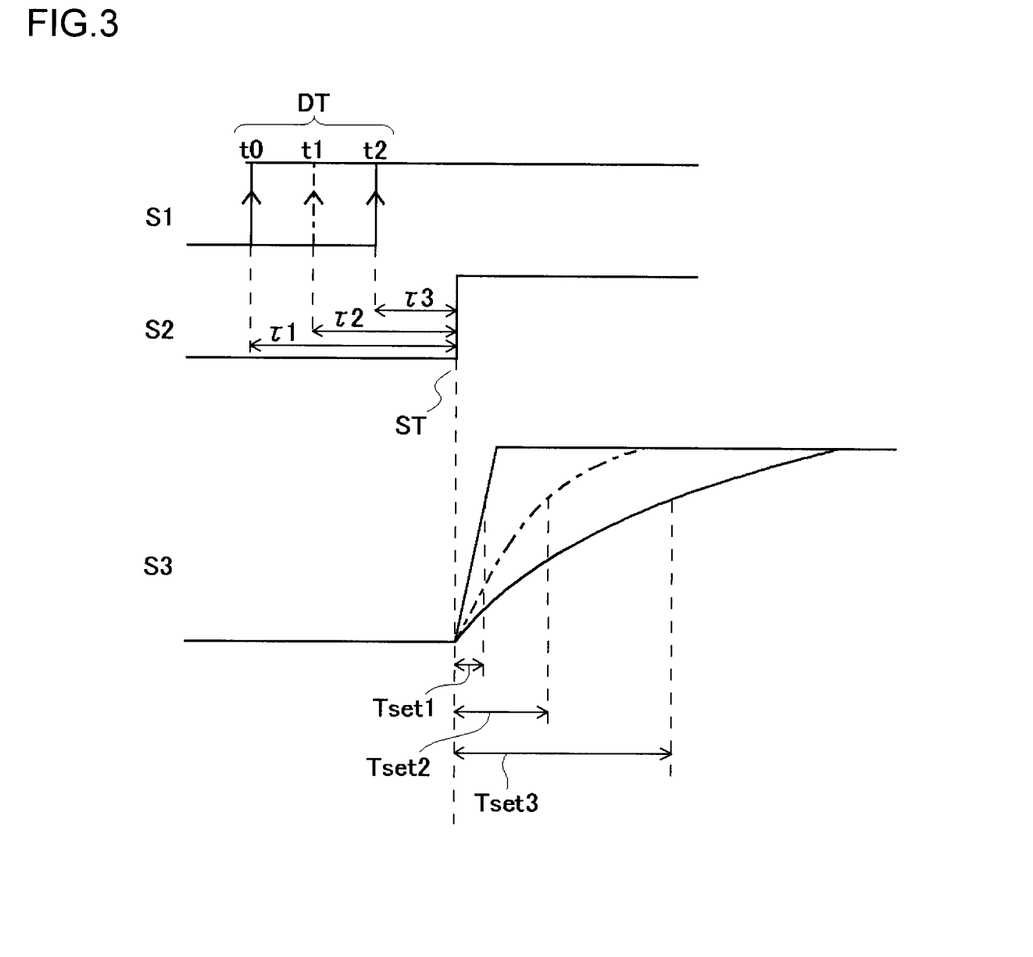
FIG. 3 is a time chart which shows the relation between a data signal, a timing signal, and an output signal in a latch circuit or a flip-flop.

FIG. 3 is a time chart which shows the relation between the data signal S1, the timing signal S2, and the output signal S3 in the latch circuit or the flip-flop. The vertical axis and the horizontal axis shown in the time chart in the present specification are expanded or reduced as appropriate for ease of understanding. Also, each waveform shown in the drawing is simplified or modified for ease of understanding.

If an edge of the data signal S1 occurs at a time point t0 that is at least the setup time Ts before a positive edge of the timing signal S2 (i.e., the sampling timing ST), the output signal S3 transits for a predetermined settling time Tset1. As the transmission edge timing DT of the data signal S1 is delayed as indicated by the time points t1 and t2, the setup margin becomes insufficient. This reduces the transition speed of the output signal S3, leading to the settling times Tset2 and Tset3 becoming large.

That is to say, the value of the settling time Tset in the metastable state corresponds to the time difference $\pi$ (=ST−DT) between the transition timing DT of the data signal and the sampling timing ST. The settling time Tset corresponds to the time difference $\pi$ in a one-to-one manner. Furthermore, the settling time Tset is of an order greater than that of the time difference $\pi$.

In general, there is a need to design a circuit such that such a metastable state does not occur. However, the time measurement circuit 10 according to the embodiment proactively uses the settling time Tset of a flip-flop or a latch circuit in the metastable state to measure the time difference between the first signal S1 and the second signal S2.

The transition time measurement circuit 14 measures the period of time required for the output signal S3, which gradually transits over time, of the time measurement circuit 10 to transit and to reach a predetermined level (which will also be referred to as the "settling time Tset" hereafter).

The above is the configuration of the time measurement circuit 10. The operation of the time measurement circuit 10 can be understood with reference to the time chart shown in FIG. 3. That is to say, the sampling circuit 12 converts the time difference π between the first signal S1 and the second signal S2 into the settling time Tset, thereby extending the time difference π in the time axis direction. The transition time measurement circuit 14 measures the settling time Tset so as to determine the time difference π between the first signal S1 and the second signal S2.

With the time measurement circuit 10 shown in FIG. 2, the time scale of such an infinitesimal time difference, on the order of the setup time or shorter, is extended in the time axis direction by several times to several hundred times the setup time, and the period of time thus extended is measured. Thus, such an arrangement has the advantage that the time resolution required for the transition time measurement circuit 14 is reduced.

If the time difference between the two signals Sstart (=S1) and Sstop (=S2) must be measured at a resolution of 10 ps using the TDC 300 shown in FIG. 1, there is a need to design such a circuit with a time difference Δt (=t1−t2) of 10 ps. That is to say, the delay elements D1 and D2 must be designed and adjusted with high precision, leading to increased difficulty in the circuit design.

In contrast, with the time measurement circuit 10 according to the embodiment, the time resolution required to measure the time difference between the first signal S1 and the second signal S2 is converted into the time resolution of tens to hundreds of picoseconds that is required to measure the settling time Tset thus extended on the order of several to tens of nanoseconds. Thus, such an arrangement provides a simple configuration of the transition time measurement circuit 14. The configuration of the transition time measurement circuit 14 is not restricted in particular. Rather, various kinds of currently-available or prospectively-available analog circuits or digital circuits having a time resolution of tens to hundreds of picoseconds may be employed as the transition time measurement circuit 14. The measurement result obtained by the transition time measurement circuit 14 may be output in the form of an analog electrical signal or in the form of a digital value.

Figure 4:
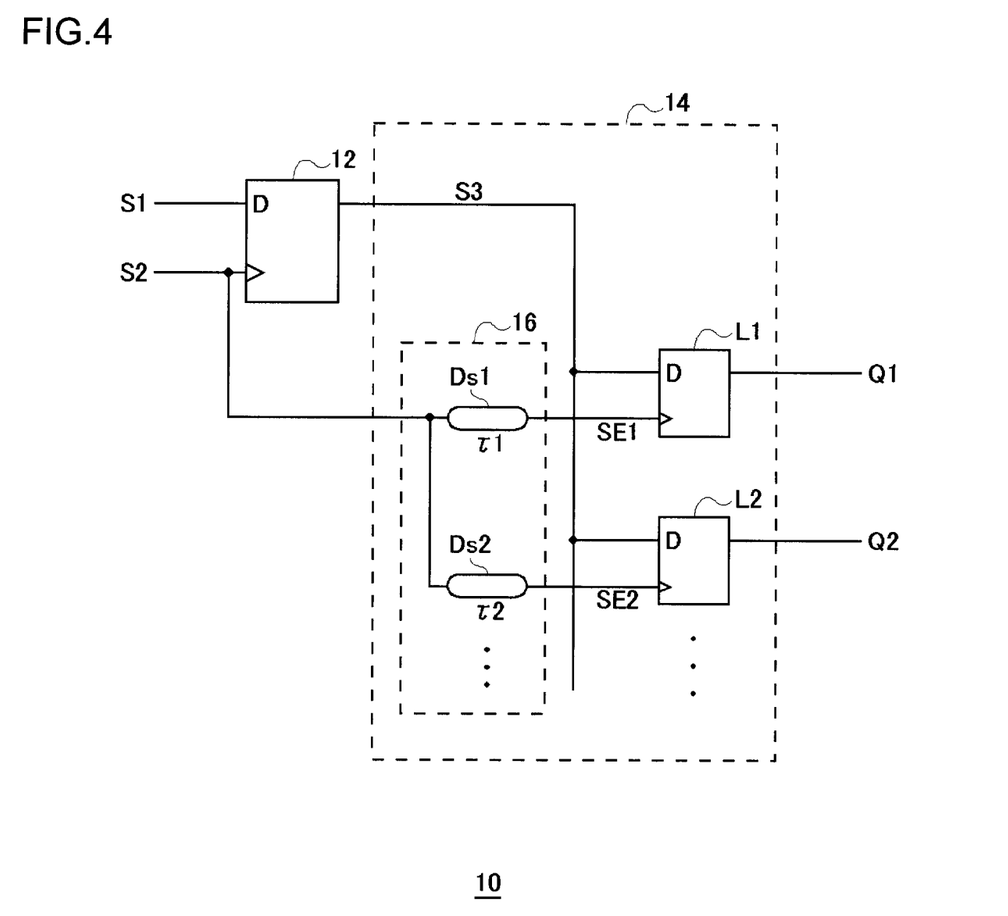
FIG. 4 is a circuit diagram which shows a specific example configuration of a time measurement circuit according to an embodiment.

FIG. 4 is a circuit diagram which shows a specific example configuration of the time measurement circuit 10 according to the embodiment. The transition time measurement circuit 14 includes multiple latch circuits L1 and L2 and a reference edge signal generating circuit 16.

An output signal S3 of the sampling circuit 12 is input to the data terminal (input terminal) of each of the multiple latch circuits L1 and L2 each shown as a D flip-flop. The reference edge signal generating circuit 16 generates reference edge signals SE1 and SE2 at timings having a predetermined time interval Δπ, and outputs the reference edge signals SE1 and SE2 thus generated to the multiple latch circuits L1 and L2, respectively.

The reference edge signal generating circuit 16 includes multiple delay elements Ds1 and Ds2 provided to the multiple respective latch circuits L1 and L2. The delay elements Ds1 and Ds2 respectively apply the delay amounts π1 and π2 to the second signal S2. The second signals S2 thus delayed are supplied to the clock terminals of the respective latch circuits. Different signals other than the second signal S2 may be employed as the input signals to be input to the reference edge signal generating circuit 16.

The interval between the reference edge signals SE1 and SE2 should be set according to the time resolution required for the transition time measurement circuit 14. For example, in a case in which the settling time Tset of the sampling circuit 12 is measured at a time resolution of 100 ps, the difference between the delay amounts π1 and π2 should be set to 100 ps.

It should be noted that, for simplicity of description, FIG. 4 shows the two latch circuits L1 and L2. However, the number of latch circuits is determined based upon the time measurement range (maximum measurement time) required for the transition time measurement circuit 14. For example, with the difference between the delay amounts π1 and π2 as Tx, and with the maximum measurement time as Ty, the number of required latch circuits is represented by Ty/Tx.

Figure 5:
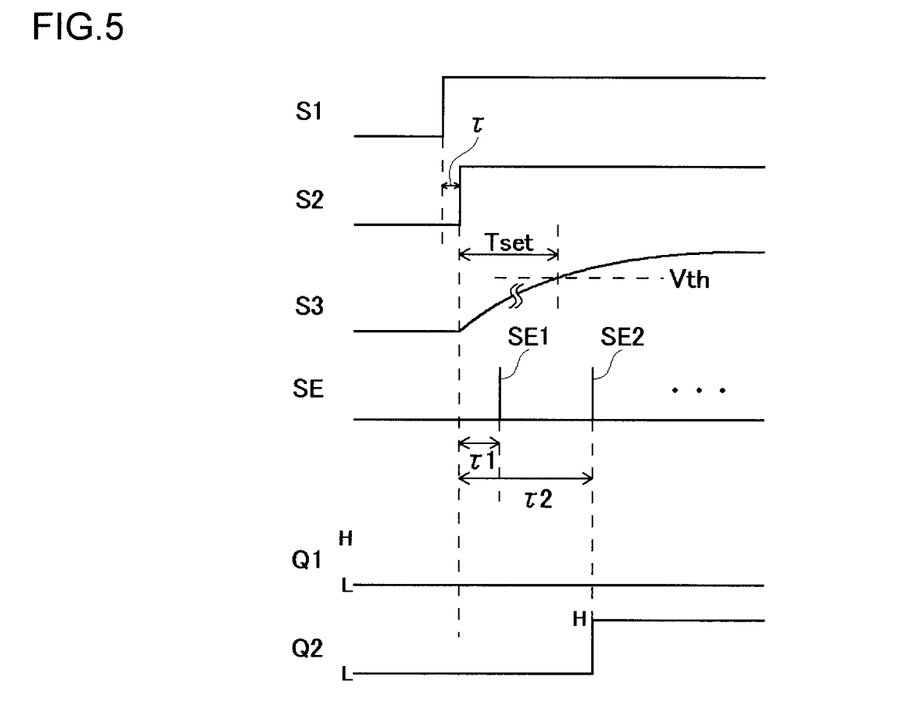
FIG. 5 is a time chart which shows the operation of the time measurement circuit shown in FIG. 4.

The above is the configuration of the time measurement circuit 10 shown in FIG. 4. Next, description will be made regarding the operation thereof. FIG. 5 is a time chart which shows the operation of the time measurement circuit 10 shown in FIG. 4. When the time difference π between the positive edges of the first signal S1 and the second signal S2 does not satisfy the setup condition required for the sampling circuit 12, the sampling circuit 12 enters the metastable state. In this metastable state, the output signal S3 takes a long period of time, on the order of 100 ps, to transit from low level to high level.

The reference edge signals SE1 and SE2 generated by the reference edge signal generating circuit 16 are respectively delayed by π1 and π2 in comparison with the positive edge of the second signal S2. The start time point of the settling time Tset is the timing of the positive edge of the second signal S2. Thus, by inputting the second signal S2 to the reference edge signal generating circuit 16, and by using the second signal S2 thus input as the reference for the reference edge signals SE1 and SE2, such an arrangement is capable of measuring the settling time Tset with high precision.

The latch circuits L1 and L2 latch the output signal S3 of the sampling circuit 12 at timings of the reference edge signals SE1 and SE2, respectively. As a result, the output signal Q1 of the latch circuit L1 is set to low level, and the output signal Q2 of the latch circuit L2 is set to high level. That is to say, the settling time Tset is quantized by the digital value represented by Q1 and Q2. The settling time Tset corresponds to the time difference π between the first signal S1 and the second signal S2 in a one-to-one manner. Thus, the digital value represented by Q1 and Q2 corresponds to the time difference π.

With the time measurement circuit 10 shown in FIG. 4, the latch circuits L1 and L2 measure the settling time Tset that is extended in the time axis direction on the order of several hundred picoseconds to several nanoseconds. Thus, such an arrangement does not require high time resolution. For example, for such an arrangement, it is sufficient to design the delay amounts π1 and π2 to be on the order of 100 picoseconds, thereby allowing the circuit to be easily designed.

It should be noted that a pulse sequence or a multi-strobe signal having time delay Δπ may be employed instead of generating the reference edge signals SE1 and SE2 using the delay elements Ds1 and Ds2.

Figure 6A:
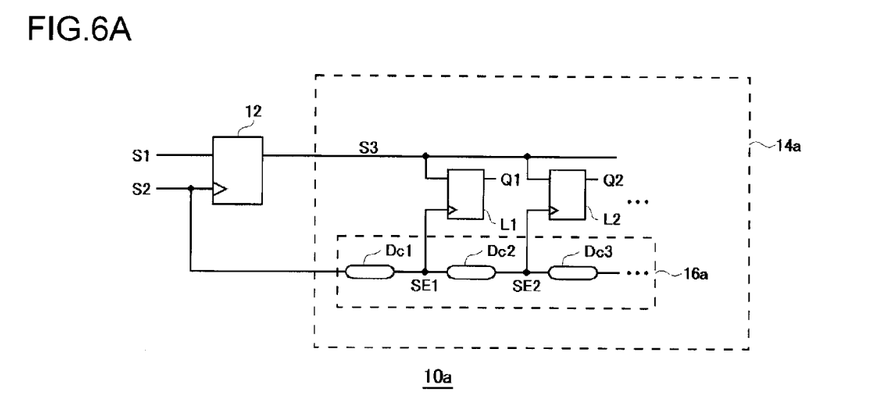
FIG. 6 is a circuit diagram which shows a modification of the time measurement circuit shown in FIG. 4.
Figure 6B:
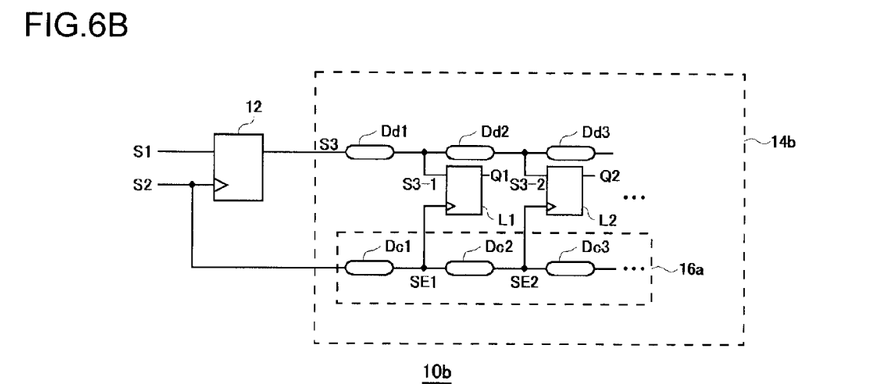
Figure 6C:
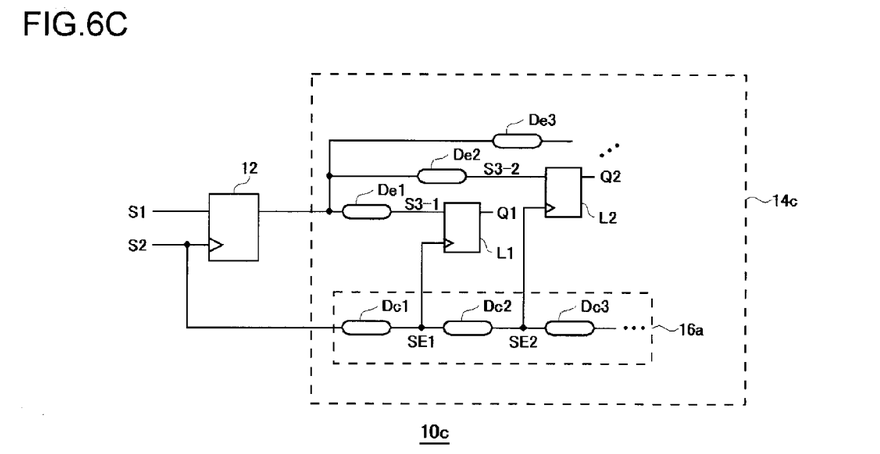

FIGS. 6A through 6C are circuit diagrams each showing a modification of the time measurement circuit shown in FIG. 4. A time measurement circuit 10a shown in FIG. 6A includes a reference edge signal generating circuit having a configuration that differs from that of the time measurement circuit 10 shown in FIG. 4. That is to say, the reference edge signal generating circuit 16a includes multiple delay elements Dc1, Dc2, and so on (which are collectively referred to as "Dc") which are cascade-connected. The multiple reference edge signals SE1, SE2, and so on are output via taps provided to the input terminals or the output terminals of the delay elements Dc. With the delay amount to be applied by the i-th stage delay element Dci as πci, the reference edge SEi to be supplied to the i-th stage latch circuit Li is obtained by applying $\pi i$ $(=\Sigma\pi cj=\pi c1+\pi c2+\ldots,+\pi ci)$ to the timing signal S2.

A time measurement circuit 10b shown in FIG. 6B includes multiple delay elements Dd1, Dd2, and so on (which will be collectively referred to as "Dd"), in addition to the time measurement circuit 10a shown in FIG. 6A. The multiple delay elements Dd are cascade-connected. The output signal S3 is input to the first-stage delay element Dd1. Output signals S3_1, S3_2, and so on, are output via taps provided to the input terminals or the output terminals of the delay elements Dd. With the delay amount to be applied by the i-th stage delay element Ddi as $\pi di$, the delayed output signal S3_i to be supplied to the i-th stage latch circuit Li is obtained by applying $\Sigma\pi d$ $(=\pi d1+\pi d2+,\ldots,+\pi di)$ to the output signal S3.

With the time measurement circuit 10b shown in FIG. 6B, the relative time difference $\Delta\pi i$ between the delayed output signal S3_i input to the i-th stage latch circuit Li and the reference edge signal SEi is represented by the Expression $\Delta\pi i=\pi i-\pi di$. The time difference $\Delta\pi i$ shown in FIG. 6B represents a delay amount that corresponds to $\pi i$ shown in FIG. 4.

A time measurement circuit 10c shown in FIG. 6C includes multiple delay elements De1, De2, and so on (which will be collectively referred to as "De"), instead of the multiple delay elements Dd shown in FIG. 6B. With the delay amount applied by the i-th delay element Dei as $\pi ei$, the relation $\pi ei=\Sigma\pi d=\pi d1+\pi d2+,\ldots,+\pi di$ holds true.

The reference edge signal generating circuit 16a shown in FIG. 6A may be employed in the time measurement circuit 10b shown in FIG. 6B or the time measurement circuit 10c shown in FIG. 6C.

The time measurement circuit 10 shown in FIG. 4 and the time measurement circuits 10a through 10c shown in FIG. 6A through FIG. 6C will be collectively referred to as the time measurement circuit 10 hereafter.

Next, description will be made regarding a technique for improving the precision of the time measurement operation of the time measurement circuit 10. The time measurement circuit 10 uses the settling time Tset of a latch circuit or a flip-flop in the metastable state to perform time measurement. Accordingly, for high-precision time measurement it is important to adjust the settling time Tset.

Thus, the time measurement circuit 10 according to an embodiment has a function of adjusting the settling time Tset. Adjustment of the settling time Tset can be realized by adjusting and changing the size or the bias state of a buffer provided to such a flip-flop or a latch circuit.

Figure 7:
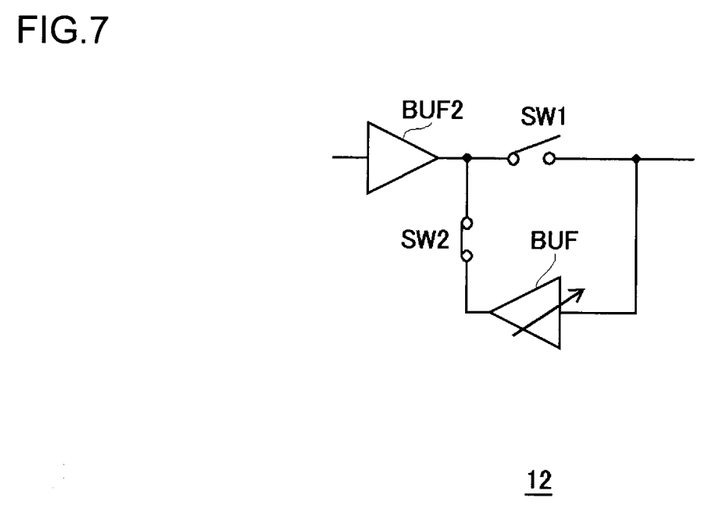
FIG. 7 is a circuit diagram which shows a part of the configuration of a sampling circuit employed in the time measurement circuit.

FIG. 7 is a circuit diagram which shows a part of the configuration of the sampling circuit 12 employed in the time measurement circuit 10. The sampling circuit 12 includes switches SW1 and SW2 and buffers BUF1 and BUF2. The buffer BUF2 receives the first signal S1. The switches SW1 and SW2 switch on and off in a complementary manner according to the second signal S2 input to the clock terminals thereof. In general, a sampling circuit 12 includes the feedback buffer BUF2 configured to feed back the output signal D, regardless of the configuration of the sampling circuit 12.

The greatest influence on the settling time Tset is the feedback amount of the output signal. Seen from another point of view, the greatest influence is the feedback speed or the feedback bandwidth. Thus, by configuring the BUF1 to have a variable size, such an arrangement is capable of suitably adjusting the settling time Tset. The adjustment of the size of the buffer can be realized by providing multiple circuit elements (transistors) connected in parallel, and by switching the number of circuit elements that contribute to the circuit operation. The switching of the number of circuit elements may be performed using a switch, and also may be realized by mechanical trimming performed in the manufacturing process for the time measurement circuit 10.

Alternatively, an arrangement may be made configured to allow the bias state of the buffer BUF1, e.g., the power supply voltage or the bias current, to be adjusted. Also, an arrangement may be made configured to allow the size or the bias state of the input buffer BUF2 to be adjusted instead of, or in addition to, the size or the bias state of the feedback buffer BUF1.

Also, at least one of the switches SW1 and SW2 may be configured to have an adjustable size. Such an arrangement is capable of adjusting the settling time Tset according to the size thus set.

Also, in order to adjust the settling time Tset, the sampling circuit 12 may include, as an internal component, another circuit element, e.g., a variable resistor or a variable capacitor. Such an arrangement allows the resistance value of the resistor or the capacitance value of the capacitor to be adjusted.

It should be noted that the sampling circuit 12 shown in FIG. 7 is shown, for exemplary purposes only, as a schematic example obtained by simplifying the configuration employing the latch circuits or flip-flops. Various modifications and various topologies may be made with respect to such a sampling circuit employing latch circuits or flip-flops, which can be readily conceived by those skilled in this art.

Description will be made regarding an example of an application of the time measurement circuit 10 having such a configuration. The time measurement circuit 10 can be suitably applied to a TDC. The TDC is mounted on a test apparatus such as automatic test equipment (ATE), time interval analyzers, jitter measurement apparatuses, etc.

Figure 8:
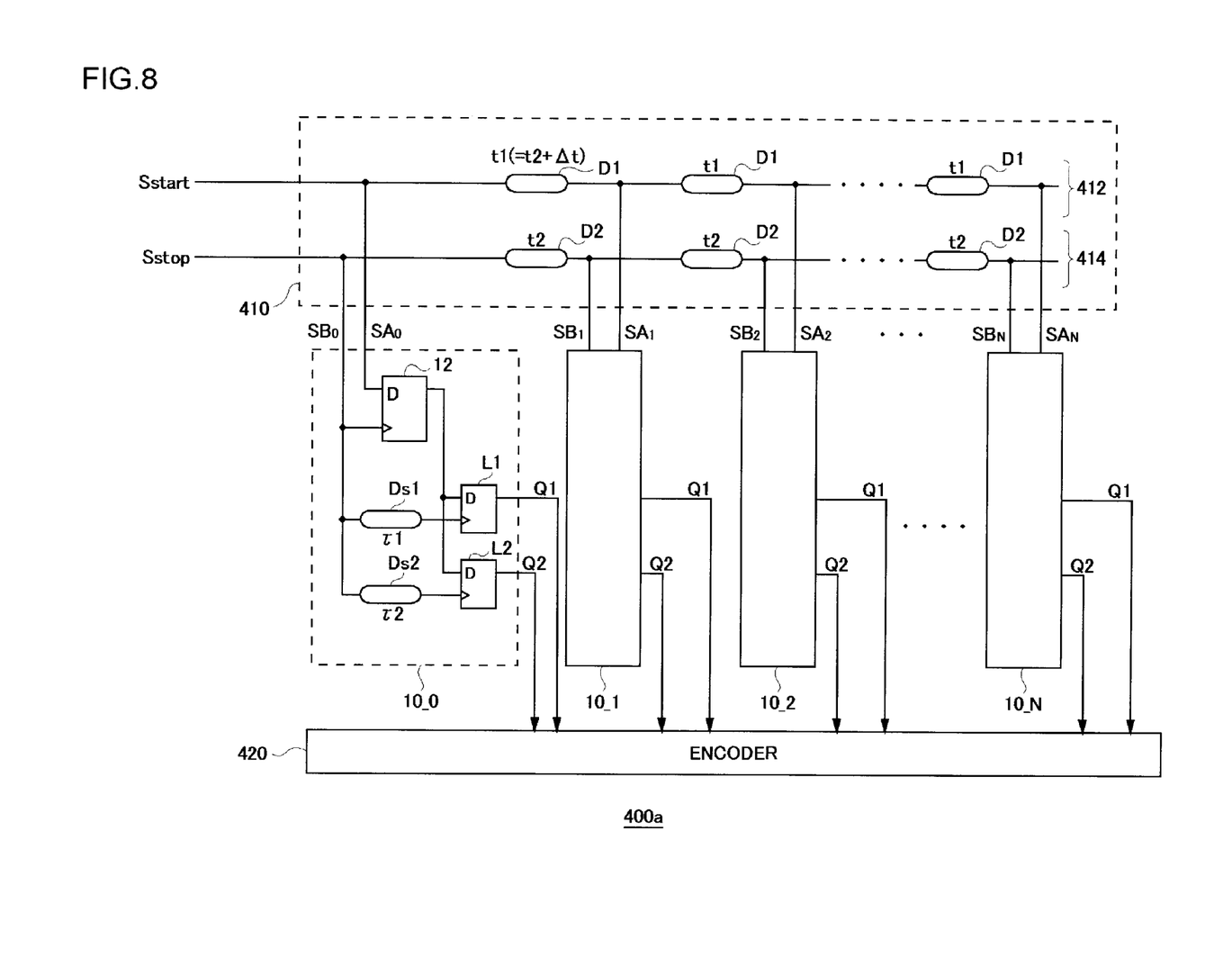
FIG. 8 is a block diagram which shows a configuration of a TDC employing the time measurement circuit.

FIG. 8 is a block diagram which shows a configuration of a TDC 400a employing the time measurement circuit 10. The TDC 400a includes a vernier delay circuit 410, multiple time measurement circuits 10, and an encoder 420.

The vernier delay circuit 410 receives a start signal Sstart and a stop signal Sstop, and applies delay amounts to the two signals in a stepwise manner.

The vernier delay circuit 410 includes a first delay circuit 412 and a second delay circuit 414. The first delay circuit 412 includes N first delay elements D1 connected in multiple stages. The first delay circuit 412 applies a predetermined first delay amount t1 to the start signal at every stage, and outputs (N+1) delayed start signals $SA_0$ through $SA_N$ to which different respective delay amounts are applied. In the same way, the second delay circuit 414 includes N second delay elements D2 connected in multiple stages. The second delay circuit 414 applies a predetermined second delay amount t2 to the start signal at every stage, and outputs (N+1) delayed start signals $SB_0$ through $SB_N$ to which different respective delay amounts are applied.

The first predetermined delay amount t1 is set to be longer than the second predetermined delay amount t2. The time difference between the start signal Sstart and the stop signal Sstop is reduced by $\Delta t=(t1-t2)$ every time the start signal Sstart and the stop signal Sstop respectively pass through a delay element stage of the first delay circuit 210 and the second delay circuit 220. In a case in which the initial time difference between the start signal Sstart and the stop signal Sstop is $\pi$, the edge timing relation between these two signals reverses at a stage in which the start signal Sstart and the stop signal Sstop have each passed through $(\pi/\Delta t)$ delay element stages.

It should be noted that, when the stop signal Sstop is input before the start signal Sstart is input, the predetermined first delay amount t1 is set to be Δt shorter than the predetermined second delay amount t2.

The number of multiple time measurement circuits 10, i.e., (N+1), is determined based upon the number of delayed start signals SA or delayed stop signals SB generated by the vernier delay circuit 410. Any one of the arrangements shown in FIG. 4 and FIG. 6A through 6C may be employed as the time measurement circuit 10 shown in FIG. 8 and FIG. 9 through FIG. 11 described later.

The j-th ($0 \leq j \leq N$) stage time measurement circuit 10_j receives, as the aforementioned first signal S1, the delayed start signal $SA_j$ output from the j-th stage, and receives, as the aforementioned second signal S2, the delayed signal $SB_j$ output from the j-th stage. In the present specification, the stage immediately before the first stage will be referred to as the "0-th stage". That is to say, the 0-th stage time measurement circuit 10_0 receives the start signal $SA_0$ before any delay amount is applied and the start signal $SB_0$ before any delay amount is applied.

In each stage time measurement circuit 10, the metastable state is used to extend the delay amount between the delayed start signal SA and the delayed start signal SB thus input, and the settling time Tset thus extended is measured so as to generate the data DQ1, DQ2, and so on that correspond to the delay amount. The data DQ1 and DQ2 thus generated by each stage time measurement circuit 10 are input to the encoder 420, and are encoded into a format that is suitable for the subsequent processing, such as binary data.

The above is the configuration of the TDC 400a according to the embodiment. Next, description will be made regarding the operation thereof. Here, the start signal Sstart and the stop signal Sstop are input to the TDC 400a at timings that differ by a given initial time difference π. The time difference between the start signal Sstart and the stop signal Sstop is reduced by $\Delta t$ ($=t1-t2$) every time the start signal Sstart and the stop signal Sstop each pass through a delay element included within the vernier delay circuit 410. Thus, the edge timing relation between these two signals reverses at a stage in which these two signals have each passed through ($\pi/\Delta t$) delay element stages.

At the stages in the vicinity of such a stage in which the timing relation is reversed, the time difference between the delayed start signal SA and the delayed stop signal SB is small. Accordingly, when the time measurement circuit 10 receives such data, the sampling circuit 12 included in the measurement circuit 10 enters the metastable state. In this stage, the time measurement circuit 10 can measure the time difference between the delayed start signal SA and the delayed stop signal SB after extension of the time difference between them.

At each stage in which the time difference between the delayed start signal and the delayed stop signal is greater than the setup time, the time measurement circuit 10 is not in a metastable state, and a signal is acquired by a normal operation.

That is to say, with the TDC 400a shown in FIG. 8, at a stage in which the time difference between the delayed start signal SA and the delayed stop signal SB becomes small, the time measurement circuit 10 provided at that stage operates in the metastable state, thereby providing high-precision time measurement. As a result, in the overall operation of the TDC 400a, the time measurement circuits 10 operating in the normal state (not in the metastable state) operate as a coarse-precision time measurement circuit, and the vernier delay circuit 410 plus a time measurement circuit 10 operating in the metastable state operate as a fine-precision time measurement circuit. That is to say, by providing the vernier delay circuit 410 and the time measurement circuits 10, such an arrangement is capable of measuring the time difference between the start signal Sstart and the Sstop at two time resolutions.

The advantages and superior effectiveness of the TDC 400a shown in FIG. 8 can be clearly understood in comparison with the TDC 300 shown in FIG. 1. Description will be made regarding a case in which the start signal Sstart and the stop signal Sstop are measured over a time measurement range Δy at a time resolution of Δx.

With the conventional TDC 300 shown in FIG. 1, the time resolution Δx is equal to the difference Δt ($=t1-t2$) between the delay amounts applied by the first delay element D1 and the second delay element D2. Accordingly, in order to provide the time measurement range Δy, the number of stages required for such an arrangement is (Δy/Δx). Specifically, an arrangement in which Δx=10 ps and Δy=1 ns requires 100 stages of delay elements and thermometer latches TL. That is to say, the circuit scale increases in proportion to the time measurement range, and is inversely proportional to the resolution.

In contrast, with the TDC 400a shown in FIG. 8, the vernier delay circuit 410 does not require such a fine time resolution Δt ($=t1-t2$). This is why the ultimate time resolution provided by the TDC 400a is determined by the metastable state operation of the time measurement circuits 10 provided as downstream components. Specifically, with the TDC 400a shown in FIG. 8, the vernier delay circuit 410 requires a time resolution Δt only on the order of 100 ps. Thus, such an arrangement requires only ten stages of delay elements and time measurement circuits 10.

Furthermore, in order to provide a 10 ps time resolution Δx using the time measurement circuit 10, a difference (π1−π2) on the order of 100 ps between the delay amounts applied by the delay elements Ds1 and Ds2 is sufficient. This is why the time measurement circuit 10 measures the time difference between the first signal SA and the second signal SB after the original time difference is extended on the order of ten times to several hundred times. Thus, the time measurement circuits 10 can be designed with a small circuit scale.

As described above, a TDC 400a according to the embodiment provides high-time-resolution and wide-range time measurement with a smaller circuit scale than that of conventional arrangements. Seen from another point of view, a TDC 400a according to the embodiment having the same circuit scale as that of conventional arrangements provides further improved time resolution, or further improved time measurement range.

In a case in which the time resolution Δt of the vernier delay circuit 200 is set to 10 ps in conventional arrangements, there is a need to suppress irregularities in the delay amounts to be applied by the delay elements D1 and D2, leading to constraints on the circuit design. In contrast, the TDC 400 according to the embodiment requires only low time resolution in the vernier delay circuit 410, thereby reducing the burdens on the design and manufacturing process as compared with conventional arrangements.

Figure 9:
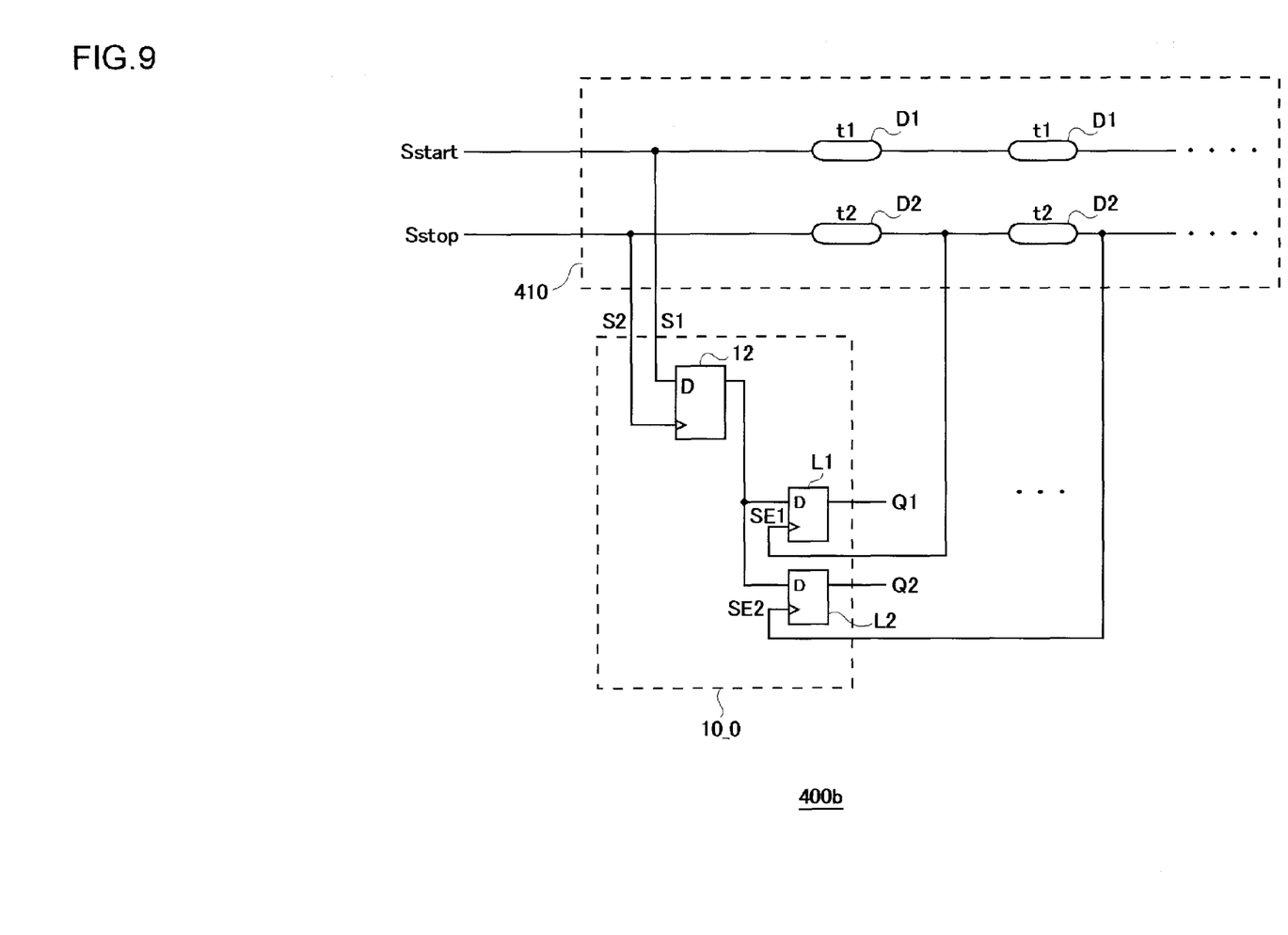
FIG. 9 is a circuit diagram which shows a first modification of the TDC.

FIG. 9 is a circuit diagram which shows a first modification 400b of the TDC. In the circuit diagram shown in FIG. 9, only the first-stage time measurement circuit 10_0 is shown, and other time measurement circuits are not shown. In the time measurement circuit 10 shown in FIG. 8, the delayed stop signal SB that corresponds to the second signal is delayed by means of the delay elements Ds1 and Ds2 so as to generate the reference edge signals SE1 and SE2. In contrast, the time measurement circuit 10 shown in FIG. 9 uses the second delay elements D2 of the vernier delay circuit 410 instead of the delay elements Ds1 and Ds2.

That is to say, as the reference edge signals SE1 and SE2, the j-th stage time measurement circuit 10j uses the delayed stop signals $SB_k$ and $SB_l$ output from the stages downstream of the j-th stage, in addition to the delayed start signal $SA_j$ and the delayed stop signal $SB_j$ output from the j-th stage. Here, k and l represent integers which satisfy the relation k>j and l>j. In an arrangement shown in FIG. 9, k=j+1, and l=j+2. This modification can be employed in a case in which the time difference between the required reference edge signals SE1 and SE2 is proportional to the time difference Δt between the delay amounts to be applied by the delay elements D1 and D2.

With the modification shown in FIG. 9, there is no need to provide a pair of delay elements Ds1 and Ds2 for each time measurement circuit 10. Thus, such an arrangement provides a further reduced circuit scale in comparison with an arrangement shown in FIG. 8.

Figure 10:
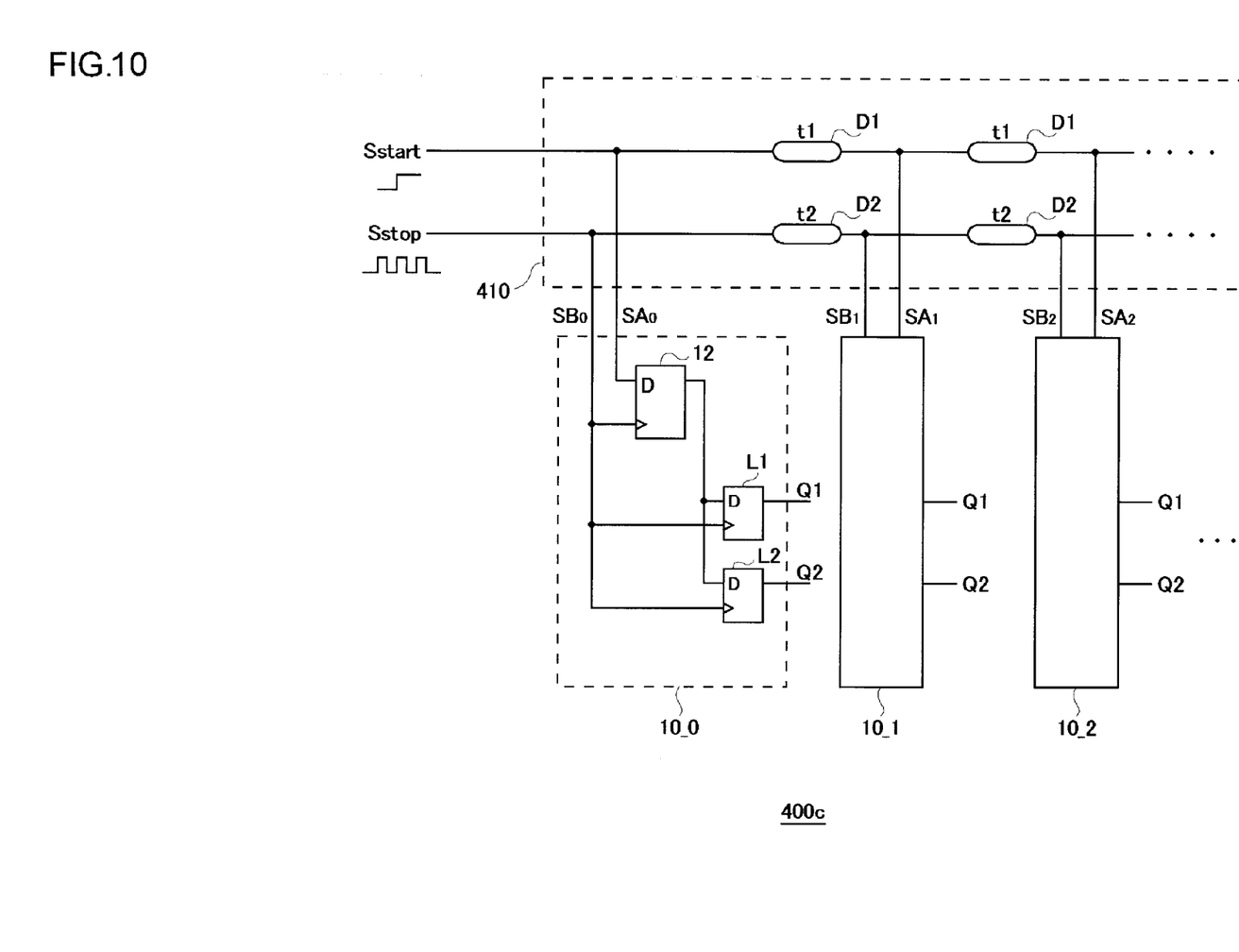
FIG. 10 is a circuit diagram which shows a second modification of the TDC.

FIG. 10 is a circuit diagram which shows a second modification 400c of the TDC. The TDC 400c shown in FIG. 10 can be employed in a case in which the stop signal Sstop is supplied in the form of a pulse sequence. In a case in which the interval between the adjacent edges of the pulse sequence is equal to the time difference between the required reference edge signals SE1 and SE2, the latch circuits L1 and L2 use the edge of the first pulse and the edge of the second pulse as the reference edge signals SE1 and SE2, respectively. Such a modification does not require delay elements Ds1 and Ds2 in increments of time measurement circuits 10, thereby further reducing the circuit scale in comparison with the arrangement shown in FIG. 8.

Figure 11:
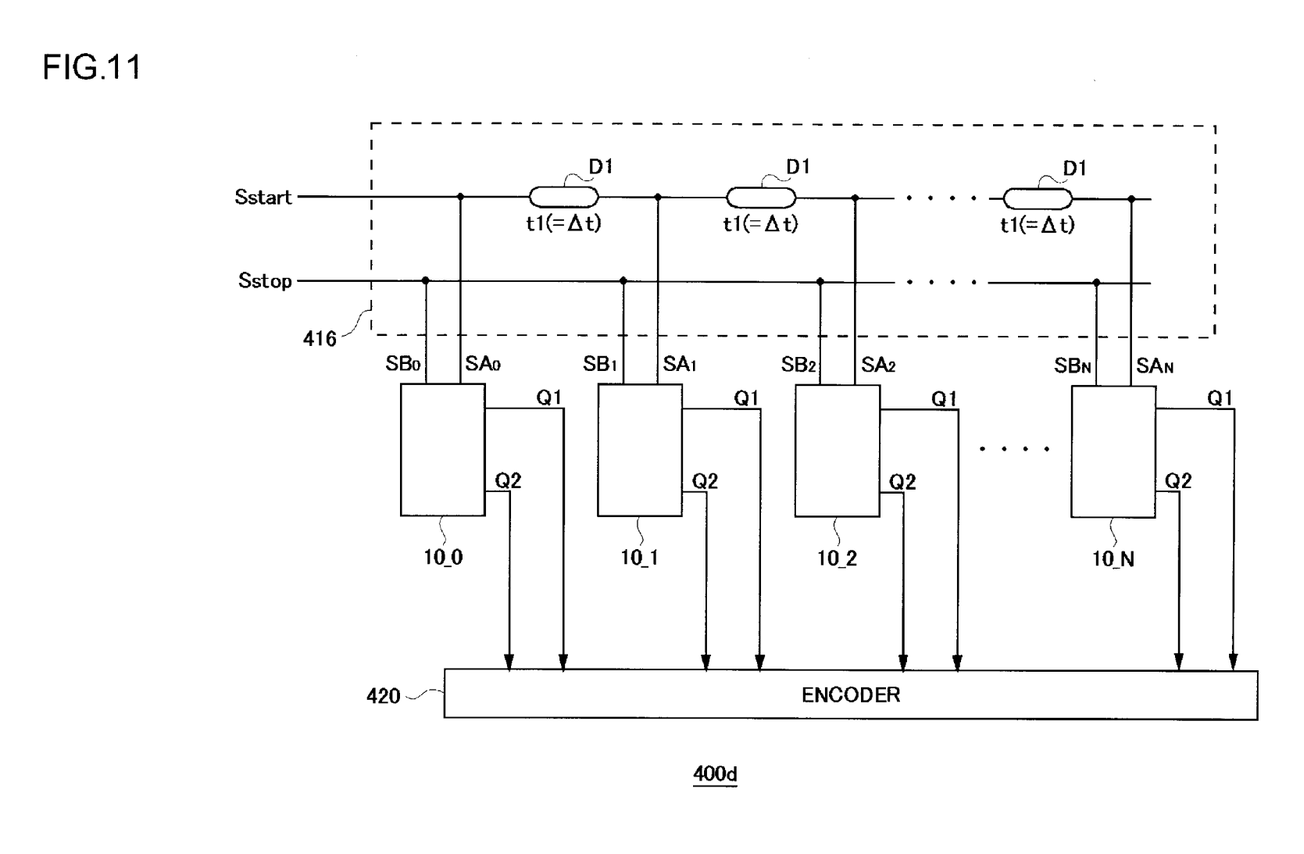
FIG. 11 is a circuit diagram which shows a third modification of the TDC.

As modifications of the TDC 400a through the TDC 400c shown in FIG. 8 through FIG. 10, a modification can be configured as follows. The vernier delay circuit 410 is configured to apply the delay amounts to both the start signal Sstart and the stop signal Sstop. Also, a modification may be made in which a delay amount is applied to only one of the start signal Sstart and the stop signal Sstop. FIG. 11 is a circuit diagram which shows a configuration of a TDC 400d according to a fourth modification. The TDC 400d includes a one-sided delay circuit 416, instead of the vernier delay circuit 410. The one-sided delay circuit 416 is equivalent to a vernier delay circuit 410 in which the delay amount of each first delay element D1 is set to Δt, and the delay amount of each delay element D2 is set to zero. Such an arrangement does not require the second delay circuit 414, thereby further reducing the circuit area. In a case in which a delay difference Δt on the order of 10 ps is required in conventional arrangements, there is a need to use a vernier delay circuit. However, the embodiment requires a delay difference Δt only on the order of 100 ps. Thus, with the present embodiment, such a delay circuit configured to delay only one side of the signals can be employed. Alternatively, the one-sided delay circuit 416 to be employed may be configured such that the delay amount t1 of each first delay element D1 is set to 0, and the delay amount t2 of each second delay element D2 is set to Δt.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A time measurement circuit configured to measure the time difference between edges of a first signal and a second signal, the time measurement circuit comprising:
   a sampling circuit configured to acquire a logical level of the first signal at a timing of an edge of the second signal, wherein the sampling circuit enters a metastable state when time difference between edges of the first signal and the second signal is shorter than a predetermined period, the predetermined period corresponding to at least one of a setup time and a hold time of the sampling circuit, and wherein a transition time of an output signal of the sampling circuit in the metastable state corresponds to the time difference in a one-to-one manner, and a time scale of the transition time is longer than a time scale of the time difference; and
   a transition time measurement circuit configured to measure the transition time of the output signal of the sampling circuit in the metastable state so as to determine the time difference.

2. A time measurement it circuit according to claim 1, wherein the transition time measurement circuit comprises a plurality of latch circuits each configured to receive an output signal of the sampling circuit via a data terminal thereof, and wherein the plurality of latch circuits receive, as input signals, respective reference edge signals having predetermined time intervals.

3. A time measurement circuit according to claim 2, wherein the transition time measurement circuit generates the reference edge signals by delaying the second signal.

4. A time measurement circuit according to claim 2, wherein the transition time measurement circuit further comprises a plurality of delay elements provided to the multiple respective latch circuits, each configured to apply a delay amount to the second signal,
   and wherein each delay element supplies the second signal thus delayed to a clock terminal of the corresponding latch circuit as the reference edge signal.

5. A time measurement circuit according to claim 2, wherein the transition time measurement circuit further comprises a plurality of delay elements cascade-connected in multiple stages,
   and wherein a delay amount is applied to the second signal at every stage,
   and wherein the delayed second signal output from each delay element is supplied to a clock terminal of the corresponding latch circuit as the reference edge signal.

6. A time measurement circuit according to claim 2, wherein the transition time measurement circuit further comprises a plurality of delay elements provided to the multiple respective latch circuits, and each configured to apply a delay amount to the output signal of the sampling circuit,
   and wherein each delay element supplies the output signal thus delayed to a data terminal of the corresponding latch circuit.

7. A time measurement circuit according to claim 2, wherein the transition time measurement circuit further comprises a plurality of delay elements cascade-connected in multiple stages,
   and wherein a delay amount is applied to the output signal of the sampling circuit for every stage,
   and wherein the delayed output signal output from each delay element is supplied to a data terminal of the corresponding latch circuit.

8. A time measurement circuit according to claim 1, wherein the sampling circuit is configured to be capable of adjusting the transition time of the output signal in a metastable state.

9. A time measurement circuit according to claim 8, wherein the sampling circuit comprises a buffer arranged on a path via which the output signal of the sampling circuit is fed back,
and wherein the buffer is configured such that the size thereof is adjustable.

10. A time measurement circuit according to claim 8, wherein the sampling circuit comprises a buffer arranged on a path via which the output signal of the sampling circuit is fed back,
and wherein the buffer is configured such that the bias state thereof is adjustable.

11. A time to digital converter configured to convert the time difference between the transition timings of a start signal and a stop signal into a digital value, the time to digital converter comprising:
a delay circuit comprising a plurality of delay elements cascade-connected in multiple stages, and configured to apply different respective delay amounts to the start signal and the stop signal at every stage, and to output the delayed signals at every stage as a delayed start signal and a delayed stop signal; and
time measurement circuits, severally arranged for every stage of the delay circuits, and each configured to receive the delayed start signal output from the corresponding stage as a first signal, and the corresponding delayed stop signal as a second signal, and to measure the time difference between edges of the first signal and the second signal,
wherein each of the time measurement circuits comprises:
a sampling circuit configured to acquire a logical level of he first signal at a timing of an edge of the second signal; and
a transition time measurement circuit configured to measure the transition time of the output signal of the sampling, circuit in the metastable state.

12. A time to digital converter according to claim 11, wherein the transition time measurement circuit comprises a plurality of latch circuits each configured to receive an output signal of the sampling circuit via a data terminal thereof,
and wherein the plurality of latch circuits receive, as input signals, respective reference edge signals having predetermined time intervals,
and wherein the time management circuit in a j-th one of said stages uses, as the reference edge signals, delayed stop signals output from stages downstream of the j-th stage, where j represents a positive integer.

13. A time to digital converter according to claim 11, wherein the transition time measurement circuit comprises a plurality of latch circuits each configured to receive an output signal of the sampling circuit via a data terminal thereof,
and wherein the plurality of latch circuits receive, as input signals, respective reference edge signals having predetermined time intervals,
and wherein the stop signal is generated in the form of a pulse sequence,
and wherein the time measurement circuit uses a number of edges selected from the pulse sequence of the stop signal as the reference edge signals.

14. A test apparatus comprising a time to digital converter according to claim 11.

15. A time to digital converter configured to convert the time difference between the transition timings of a start signal and a stop signal into a digital value, the time to digital converter comprising:
a delay circuit comprising a plurality of delay elements cascade-connected in multiple stages, and configured to apply a delay amount to the start signal at every stage, and to output the delayed signal at every stage as a delayed start signal; and
time measurement circuits severally arranged for each stage of the delay circuits, and each configured to receive the delayed start signal output from the corresponding stage as the first signal, and the stop signal as the second signal, and to measure the time difference between edges of the first signal and the second signal,
wherein each of the time measurement circuits comprises:
a sampling circuit configured to acquire a logical level of the first signal at a timing of an edge of the second signal; and
a transition time measurement circuit configured to measure the transition time of the output signal of the sampling circuit in the metastable state.

16. A time to digital converter configured to convert the time difference between the transition timings of a start signal and a stop signal, the time to digital converter comprising:
a delay circuit comprising a plurality of delay elements cascade-connected in multiple stages, and configured to apply a delay amount to the stop signal at every stage, and to output the delayed signal at every stage as a delayed stop signal; and
time measurement circuits severally arranged for each stage of the delay circuits, and each configured to receive the start signal as the first signal, and the delayed stop signal output from the corresponding stage as the second signal, and to measure the time difference between edges of the first signal and the second signal,
wherein each of the time management circuits comprises:
a sampling circuit configured to acquire a logical level of the first signal at a timing of an edge of the second signal; and
a transition time measurement circuit configured to measure the transition time of the output signal of the sampling circuit in the metastable state.

* * * * *